United States Patent
Suh et al.

(10) Patent No.: US 9,929,080 B2
(45) Date of Patent: Mar. 27, 2018

(54) FORMING A STRESS COMPENSATION LAYER AND STRUCTURES FORMED THEREBY

(75) Inventors: Daewoong Suh, Phoenix, AZ (US); Saikumar Jayaraman, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/990,228

(22) Filed: Nov. 15, 2004

(65) Prior Publication Data

US 2006/0105497 A1    May 18, 2006

(51) Int. Cl.
| H01L 21/56 | (2006.01) |
| H01L 23/498 | (2006.01) |
| H01L 21/48 | (2006.01) |
| H01L 23/00 | (2006.01) |
| H05K 3/34 | (2006.01) |
| H05K 3/30 | (2006.01) |

(52) U.S. Cl.
CPC .... *H01L 23/49816* (2013.01); *H01L 21/4853* (2013.01); *H01L 23/562* (2013.01); *H05K 3/3436* (2013.01); *H05K 3/3484* (2013.01); *H01L 21/563* (2013.01); *H01L 2924/0002* (2013.01); *H01L 2924/15311* (2013.01); *H05K 3/305* (2013.01); *H05K 2201/10977* (2013.01); *H05K 2203/043* (2013.01); *H05K 2203/0568* (2013.01); *Y02P 70/613* (2015.11)

(58) Field of Classification Search
CPC .................................................... H01L 21/563
USPC .......................................................... 438/613
See application file for complete search history.

(56) References Cited

U.S. PATENT DOCUMENTS

| 5,091,339 | A | * | 2/1992 | Carey | ............... | H01L 21/31144 |
| | | | | | | 216/18 |
| 5,411,918 | A | * | 5/1995 | Keible et al. | .................. | 257/737 |
| 5,851,911 | A | * | 12/1998 | Farnworth | .................... | 438/614 |
| 5,888,892 | A | * | 3/1999 | Yanagida | ...................... | 438/614 |
| 6,054,171 | A | * | 4/2000 | Shoji | ............................. | 438/106 |
| 6,162,652 | A | * | 12/2000 | Dass et al. | ....................... | 438/18 |
| 6,169,022 | B1 | * | 1/2001 | Saitou | ........................... | 438/613 |
| 6,197,613 | B1 | * | 3/2001 | Kung et al. | .................... | 438/106 |
| 6,228,678 | B1 | * | 5/2001 | Gilleo et al. | .................. | 438/108 |
| 6,271,107 | B1 | * | 8/2001 | Massingill et al. | ........... | 438/597 |
| 6,386,434 | B1 | * | 5/2002 | Wong | ........................ | 228/248.1 |
| 6,593,220 | B1 | * | 7/2003 | Yu et al. | ........................ | 438/612 |
| 6,783,652 | B2 | * | 8/2004 | Iijima | .................... | H05K 3/045 |
| | | | | | | 205/125 |
| 6,821,878 | B2 | * | 11/2004 | Danvir et al. | ................. | 438/613 |
| 6,869,557 | B1 | * | 3/2005 | Wago | ..................... | B82Y 10/00 |
| | | | | | | 264/106 |
| 6,924,171 | B2 | * | 8/2005 | Buchwalter et al. | ......... | 438/106 |
| 6,998,334 | B2 | * | 2/2006 | Farnworth et al. | ........... | 438/612 |
| 7,074,341 | B1 | * | 7/2006 | Kurataka | ............... | B82Y 10/00 |
| | | | | | | 216/22 |
| 7,354,698 | B2 | * | 4/2008 | Van Santen | ........... | B82Y 10/00 |
| | | | | | | 264/496 |

(Continued)

*Primary Examiner* — David Zarneke
(74) *Attorney, Agent, or Firm* — Schwabe, Williamson & Wyatt P.C.

(57) ABSTRACT

Methods of forming a microelectronic structure are described. Those methods comprise forming a stress compensation layer on a substrate, forming at least one opening within the stress compensation layer, and forming an interconnect paste within the at least one opening.

11 Claims, 10 Drawing Sheets

(56) References Cited

U.S. PATENT DOCUMENTS

| | | | |
|---|---|---|---|
| 7,365,414 B2 * | 4/2008 | Koning | H05K 3/005 |
| | | | 257/642 |
| 7,371,975 B2 * | 5/2008 | Dory | H05K 3/005 |
| | | | 174/262 |
| 2004/0126547 A1 * | 7/2004 | Coomer | H01L 21/4857 |
| | | | 428/209 |
| 2005/0116299 A1 * | 6/2005 | Koning | H05K 3/005 |
| | | | 257/374 |
| 2005/0221112 A1 * | 10/2005 | Suh | H05K 3/0014 |
| | | | 428/680 |
| 2005/0260740 A1 * | 11/2005 | Szekeres | G01N 1/36 |
| | | | 435/283.1 |

\* cited by examiner

FORMING A STRESS COMPENSATION LAYER AND STRUCTURES FORMED THEREBY

BACKGROUND OF THE INVENTION

As semiconductor technology advances for higher processor performance, package sizes may shrink and higher input/output (I/O) counts may be required to reduce manufacturing costs. Packaging technologies, especially in some chipset applications, may drive a finer pitch between interconnect structures, such as between solder balls in a ball grid array package. With the scaling of pitch, smaller ball size is expected which may pose a challenge to interconnect joint (i.e., the interface between an interconnect structure and another surface, such as a substrate or contact pad) performance.

Interconnect joint failures have been observed in many types of packaging assemblies, such as in ball grid array assemblies. These failures may be due to various stresses, such as thermal or physical stresses that may be incurred after a reflow process has been performed on the interconnect structure, for example.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
FIGS. 1a-1i represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a joint structure, are described. Those methods may comprise forming a stress compensation layer on a substrate, forming at least one opening within the stress compensation layer, and forming an interconnect paste within the at least one opening.

Figure 1B:
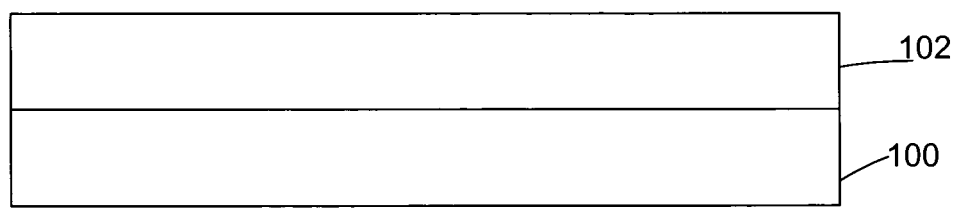

FIGS. 1a-1h illustrate an embodiment of a method of forming a microelectronic structure, such as a joint structure, for example. FIG. 1a illustrates a substrate 100. In one embodiment, the substrate 100 may comprise at least one of a package substrate, a motherboard, an interposer, a test coupon, and a land grid array. A stress compensation layer 102, such as, but not limited to, no-flow underfill type materials, as are known in the art, may be formed on the substrate 100 (FIG. 1b). In one embodiment, the stress compensation layer 102 may comprise at least one of epoxy, a cyanate ester, a polyimide, a polybenzoxazole, a polybenzimidazole, and a polybenzothiazole, for example.

The stress compensation layer 102 may be formed by such methods as dispensing and/or screen printing as are known in the art, for example. The stress compensation layer 102 may comprise any such material that may relieve stresses that may exist between interconnect structures and/or between interconnect structures and a substrate that may be subsequently joined to the interconnect structures. In one embodiment, the stresses may exist, for example, between solder balls in a ball grid array structure and/or between solder balls and a package substrate joined to the solder balls. In another embodiment, the stresses may exist between wire bonds and/or between wire bonds and a package substrate joined to the wire bonds.

Figure 1C:
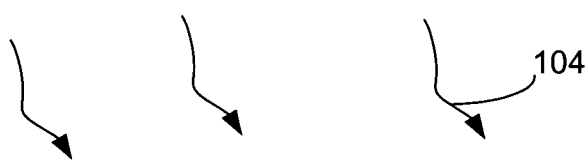
Figure 1C:
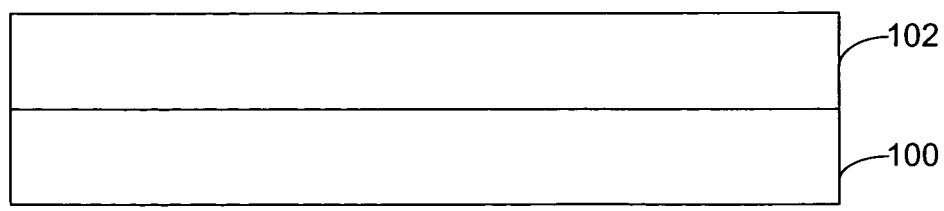

The stress compensation layer 102 may undergo a heat treatment 104 (FIG. 1c). The heat treatment 104 may remove a portion of liquid and/or moisture from the stress compensation layer 102, such as solvents, for example, as is well known in the art. The heat treatment 104 may also provide fluidity to the stress compensation layer 102 during a subsequent patterning process. The temperature of the heat treatment 104 may be less than the cure temperature of the stress compensation layer 102, so that the temperature of the heat treatment 104 may not substantially cure the stress compensation layer 102. In one embodiment, the heat treatment 104 may be from about 80 to about 120 degrees Celsius.

Figure 1D:
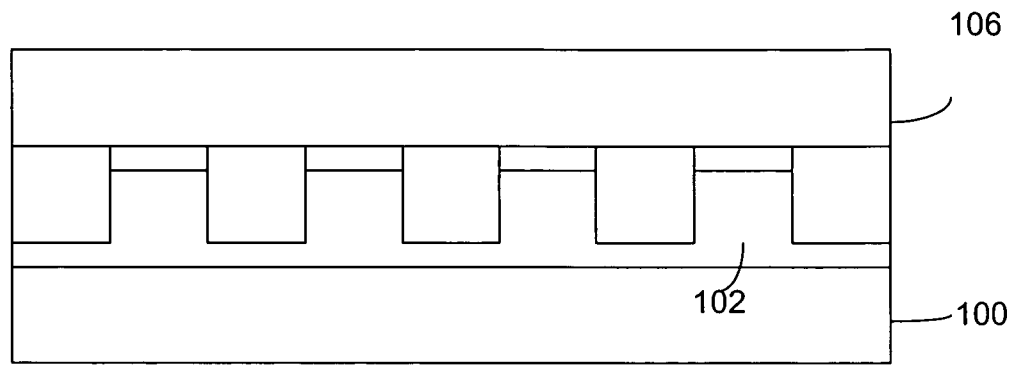

The stress compensation layer 102 may be patterned using various methods as are well known in the art. In one embodiment, the stress compensation layer 102 may be patterned using a microtool 106, as is well known in the art (FIG. 1d). The microtool 106 may comprise a nickel electroplated microtool, for example, and may generally comprise a patterning tool that may replicate a pattern into a material, such as the stress compensation layer 102. The microtool 106 may indent, or imprint, a pattern, such as but not limited to an interconnect pattern, into and/or within the stress compensation layer 102. In one embodiment, at least one opening 108 (FIG. 1e) may be formed within the stress compensation layer 102 by utilizing a patterning process, such as (but not limited to) by utilizing the microtool 106. In one embodiment, the at least one opening 108 may comprise an interconnect pattern, such as by illustration and not limitation a ball grid array interconnect pattern, as is well known in the art. The at least one opening 108 may be formed at a temperature below the cure temperature of the stress compensation layer 102. In one embodiment, the temperature that may be applied during the formation of the at least one opening 108 may comprise from about 80 to about 120 degrees Celsius. The at least one opening 108 may comprise a bottom surface 105 and at least one sidewall 107.

Figure 1E:
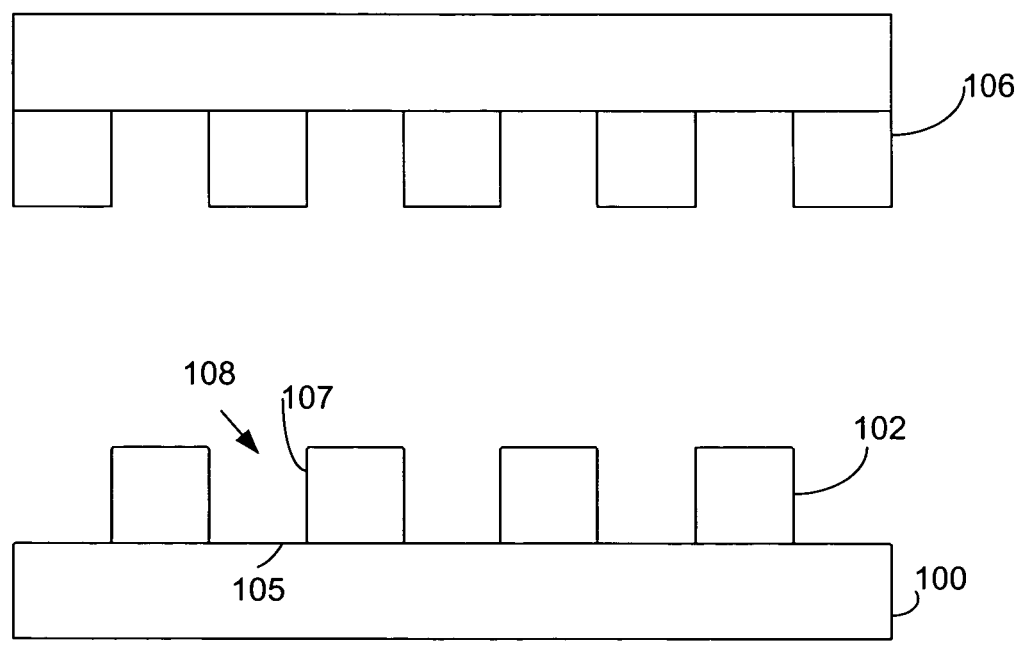
Figure 1F:
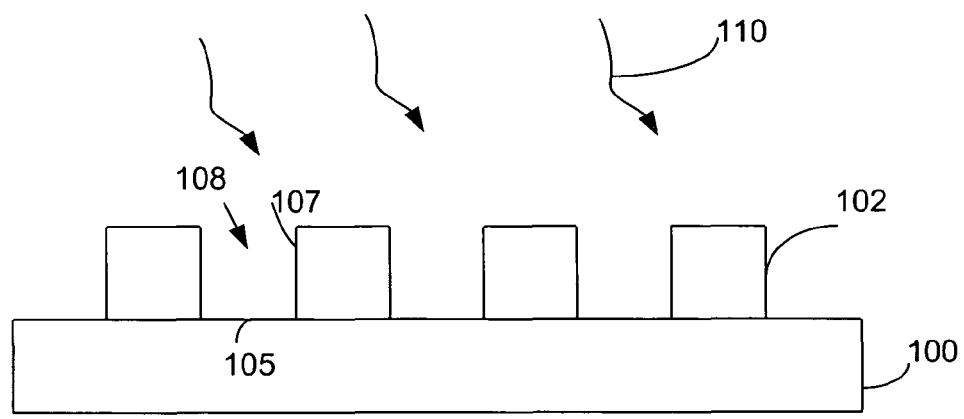

The microtool 106 may be removed from the stress compensation layer 102 after the at least one opening 108 is formed (FIG. 1e). The microtool 106 may comprise a non-stick coating, as are well known in the art, that may prevent residual material, such as stress compensation layer 102 particles etc, from remaining within the at least one opening 108. In some embodiments however, a cleaning process 110 may additionally be performed, such as an oxygen plasma cleaning process, as is well known in the art, that may remove any residual material that may be present from the at least one opening 108 (FIG. 1f).

Figure 1G:
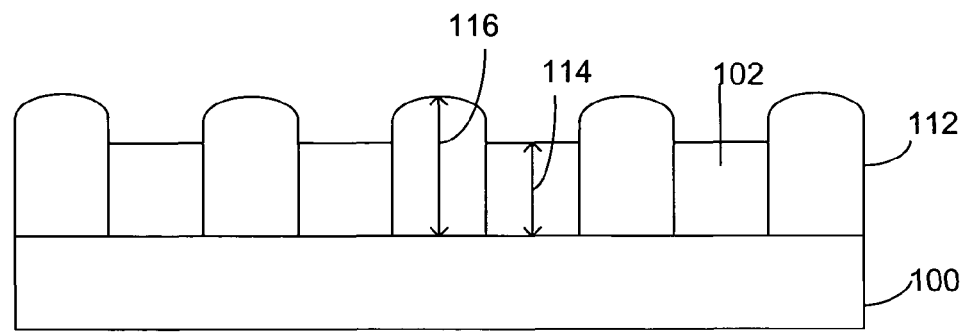

An interconnect paste 112 may be formed within the at least one opening 108 (FIG. 1g). The interconnect paste 112 may comprise any type of material or combination of materials that may be utilized to form interconnect structures, such as but not limited to ball grid array interconnect structures and/or wire bond interconnect structures, as are well known in the art. In one embodiment, the interconnect paste 112 may be formed utilizing stencil printing, solder jet or solder mold transfer techniques, as are well known in the art. In another embodiment, the interconnect paste 112 may comprise flux and/or solder balls that may be deposited within the at least one opening 108 utilizing deposition methods known in the art, such as screen printing of flux followed by solder ball placement using standard solder ball pick and place equipment. In one embodiment the interconnect paste 112 may comprise a solder paste, as is well known in the art.

Figure 1H:
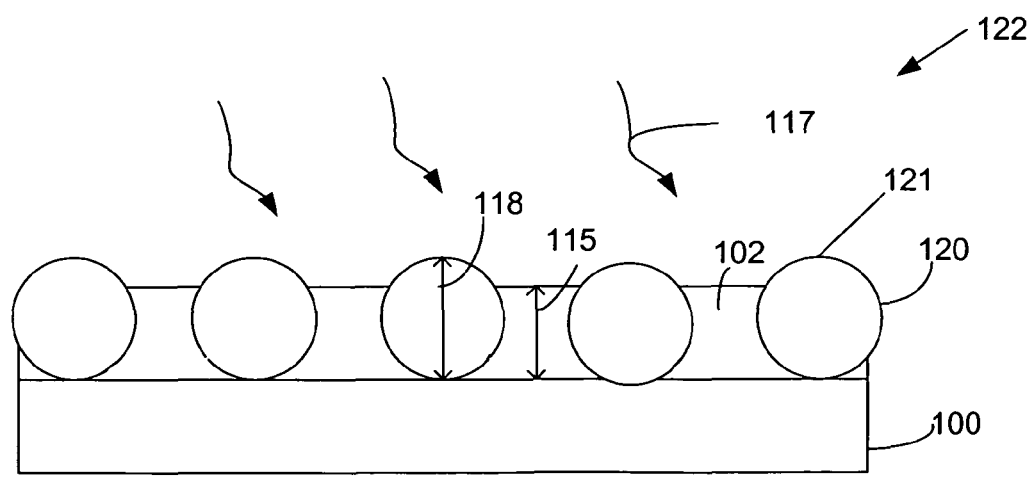

The interconnect paste 112 may comprise a height 116. A height 114 of the stress compensation layer 102 may be less than the height 116 of the interconnect paste 112. In one embodiment, the height 114 of the stress compensation layer 102 may comprise about 10 percent to about 60 percent of the height 116 of the interconnect paste 112. The interconnect paste 112 may be exposed to a heating process 117, as is known in the art, in which the interconnect paste 112 may be heated to form at least one interconnect structure 120 (FIG. 1h). A height after heating 115 of the stress compensation layer 102 may be less than the height 116 of the interconnect paste 112. In one embodiment, the heating process may comprise a reflow process and/or a die attach process, as are known in the art. In one embodiment, the heating process 117 may comprise a temperature from about 230 degrees to about 280 degrees Celsius. In one embodiment, the interconnect paste may comprise a near-eutectic Sn—Ag—Cu solder and/or paste.

The stress compensation layer 102 may be substantially cured during the heating process 117. In one embodiment, the at least one interconnect structure 120 may comprise an array, or a plurality, of interconnect structures, such as but not limited to an array of solder balls, such as a ball grid array. A joint structure 122 may generally comprise the at least one interconnect structure 120 disposed on the substrate 100 with the stress compensation layer 102 disposed between at least two of the at least one interconnect structure 120.

The at least one interconnect structure 120 may comprise a height 118. The height 114 of the stress compensation layer 102 may be less than the height 118 of the at least one interconnect structure 120. In one embodiment, the height 114 of the stress compensation layer 102 may comprise about 10 percent to about 60 percent of the height 116 of the at least one interconnect structure 120. Because the height 114 of the stress compensation layer 102 may be less than the height 118 of the at least one interconnect structure, the stress compensation layer 102 may be substantially prevented from contacting a top surface 121 of the at least one interconnect structure 120.

Figure 1I:
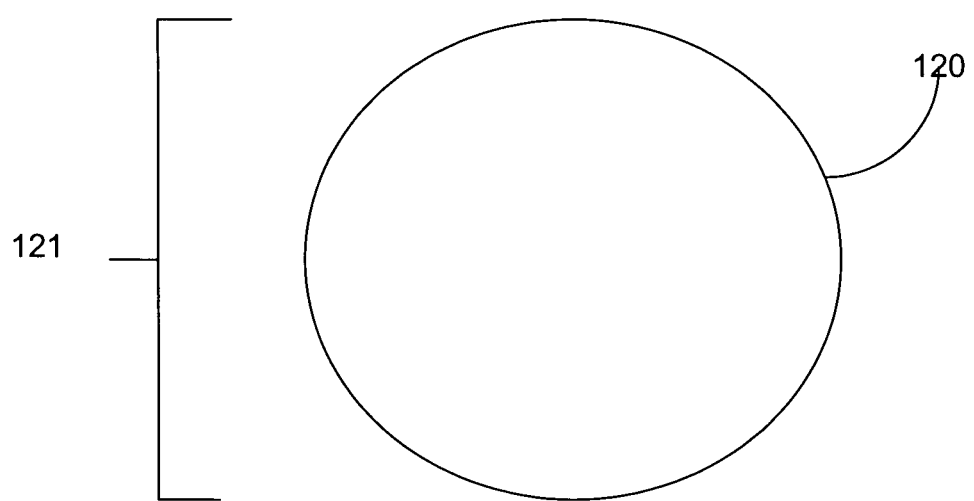
Figure 4:
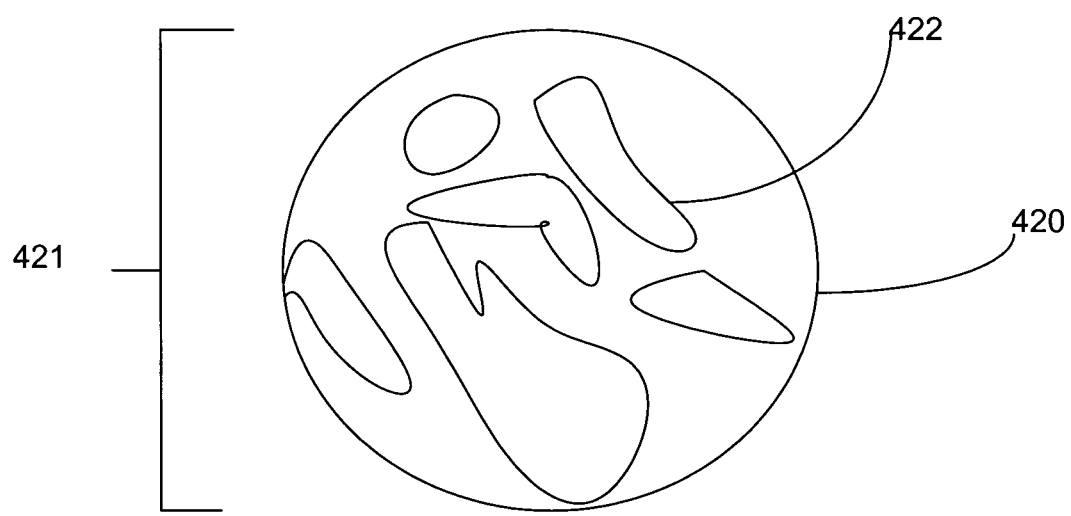
FIG. 4 represents a structure according the Prior Art.

FIG. 4 depicts a top surface 421 of an interconnect structure 420 from the prior art. The top surface 421 of the interconnect structure 420 may comprise surface contamination 422 that may arise from residual stress compensation layer material, (that may be similar to the stress compensation layer 102 of FIG. 1h, for example). FIG. 1i depicts a top view of the top surface 121 of the interconnect structure 120, wherein the top surface 121 of the interconnect structure 120 is substantially free of surface contamination. In one embodiment, the top surface 121 of the interconnect structure 120 may comprise less than about 5% surface contamination. By forming the stress compensation layer 102 prior to the formation of the interconnect structure 120, wherein the stress compensation layer 102 is lower in height than the interconnect structure 120, as in certain embodiments of the present invention, the stress compensation layer 102 is substantially prevented from contacting the top surface 121 of the interconnect structure 120. Therefore, the stress compensation layer 102 may be substantially prevented from contributing to the contamination of the top surface 121 of the interconnect structure 120 of stress compensation layer 102 material.

Figure 2A:
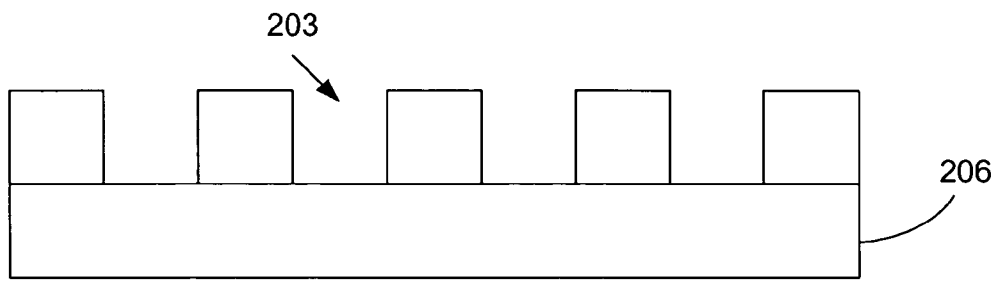
FIGS. 2a-2h represents methods of forming structures according to another embodiment of the present invention.
Figure 2B:
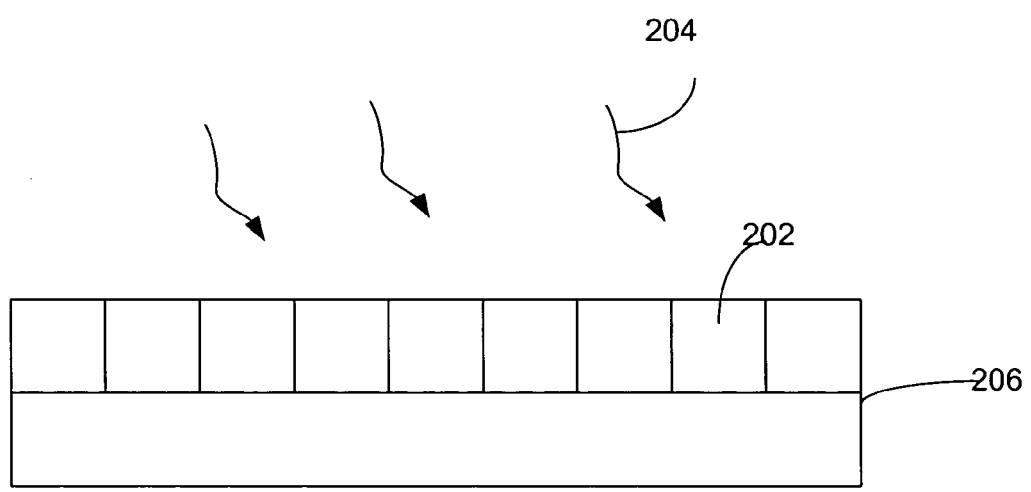

In another embodiment, a stress compensation layer 202, similar to the stress compensation layer 102, may be formed within at least one opening 203 of a first substrate 206 (FIG. 2a-2b). In one embodiment, the first substrate 206 may comprise an interconnect pattern tool. In another embodiment the first substrate 206 may comprise a microtool, for example. The first substrate 206 may comprise a silicone mold in another embodiment. The first substrate 206 may generally comprise a patterning tool that may form a pattern, such as a template for an interconnect pattern, utilizing a material, such as the stress compensation layer 202.

The stress compensation layer 202 may be formed within the at least one opening 203 of the first substrate 206 by any type of formation method, such as but not limited to screen printing, as is known in the art. The stress compensation layer 202 may undergo a heat treatment 204, similar to the heat treatment 104. The temperature of the heat treatment 204 may be less than the cure temperature of the stress compensation layer 202. In one embodiment, the heat treatment 204 may be from about 80 to about 120 degrees Celsius.

Figure 2C:
Figure 2D:
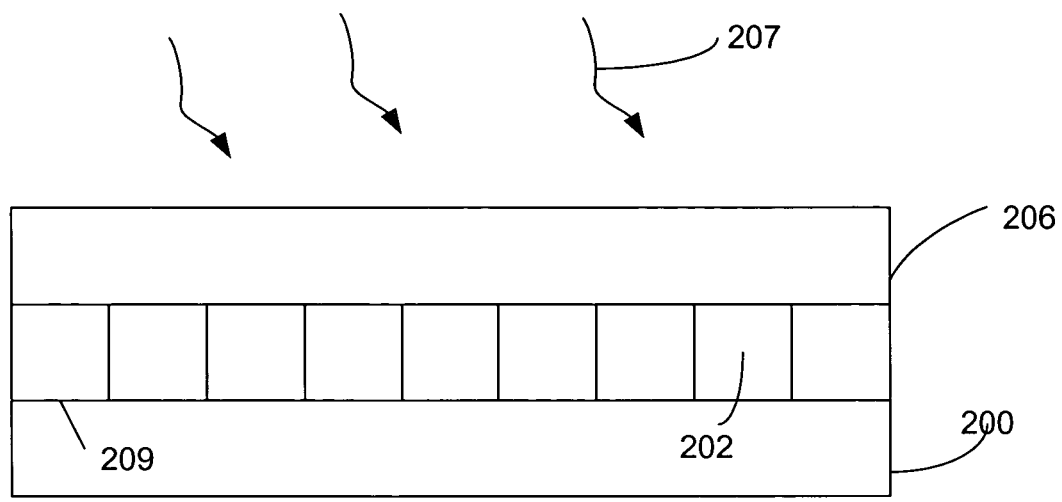

A second substrate 200 may be provided (FIG. 2c). The second substrate 200 may be placed in contact with the stress compensation layer 202 disposed within the at least one opening 203 of the first substrate 206 FIG. 2d). In one embodiment, the first substrate 206 and the second substrate 200 may be exposed to a heat process 207. The heat process 207 may comprise a temperature below the cure temperature of the stress compensation layer 202. In one embodiment, the temperature of the heat process 207 that may be applied during the contacting of the first substrate 200 and the second substrate 206 may be between about 80 and 120 degrees Celsius. Heating the first substrate 206 and the second substrate 200 may join and/or form a bond 209 between the stress compensation layer 202 and the second substrate 200.

Figure 2E:
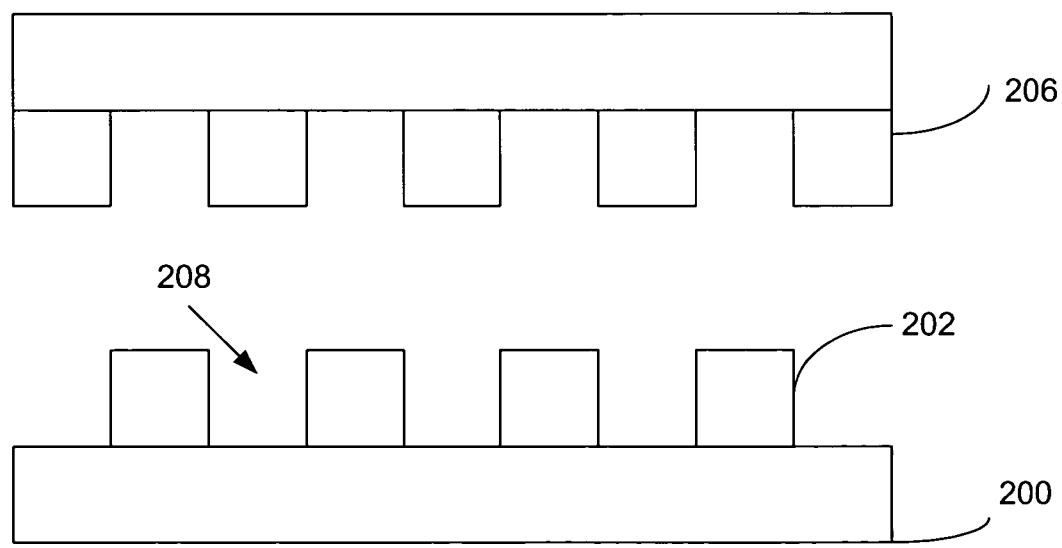

The first substrate 206 may be removed from the second substrate 200, leaving the stress compensation layer 202 bonded and/or joined to the second substrate 200 (FIG. 2e). The stress compensation layer 202 may form, i.e. transfer, the pattern from the first substrate 206 to the second substrate 200. By forming the pattern from the first substrate 206 on the second substrate 200, at least one opening 208 may be formed on the second substrate 200. In one embodiment, the at least one opening 208 may comprise an interconnect pattern, such as by illustration and not limitation a ball grid array and/or a wire bond interconnect pattern, as are well known in the art.

Figure 2F:
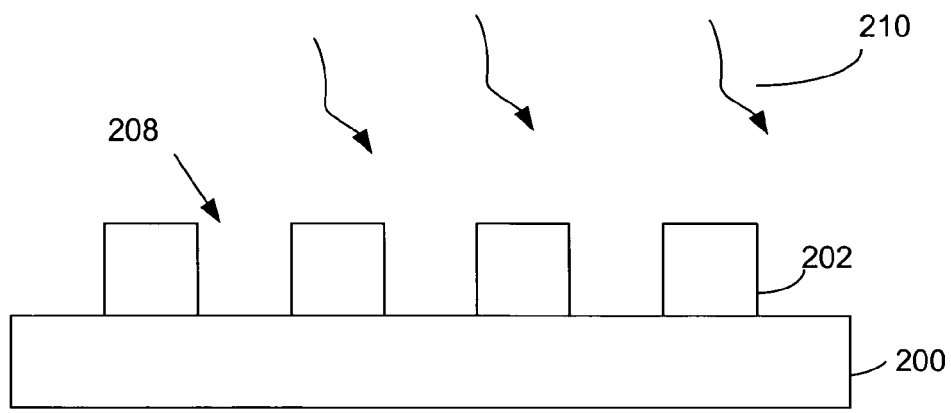

The second substrate 200 comprising the stress compensation layer 202 and the at least one opening 208 may be exposed to a cleaning process 210 (FIG. 2*f*). In some embodiments, the cleaning process 210 may comprise an oxygen plasma cleaning process, as is well known in the art, in order to remove any residual material that may be present from the at least one opening 208 (FIG. 1*f*).

Figure 2G:
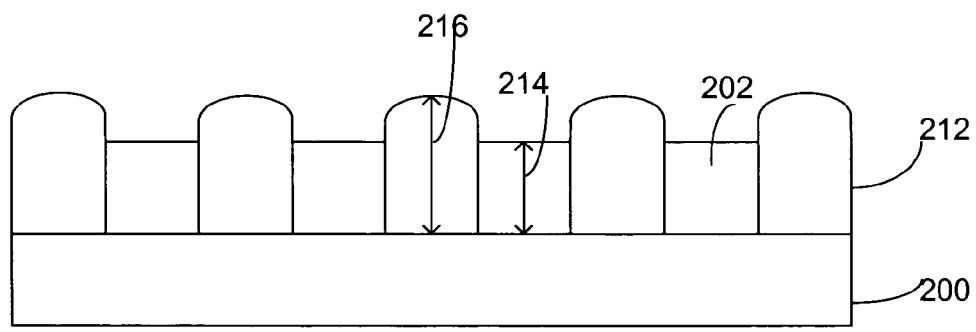
Figure 2H:
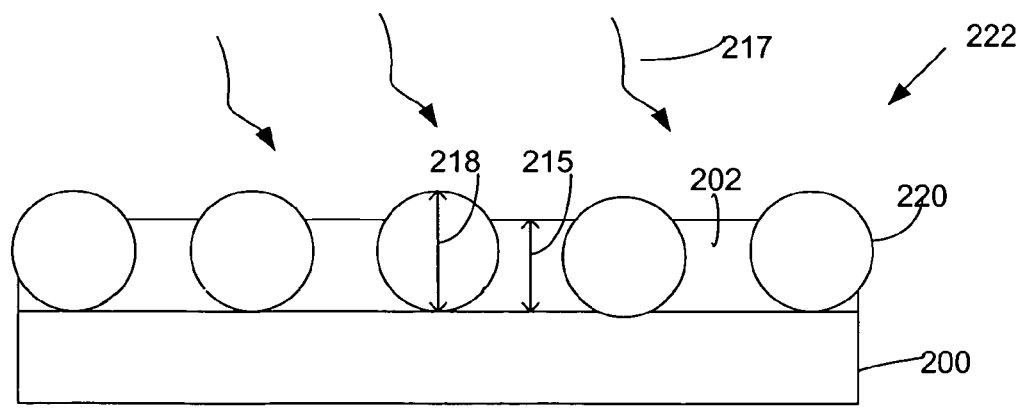

An interconnect paste 212, similar to the interconnect paste 112, may be formed within the at least one opening 208 (FIG. 2*g*). In one embodiment, the interconnect paste 212 may be formed utilizing stencil printing, solder jet or solder mold transfer techniques, as are well known in the art. In one embodiment the interconnect paste may comprise a solder paste, as is well known in the art. In another embodiment, the interconnect paste 212 may comprise flux and/or solder balls that may be deposited within the at least one opening 208 utilizing deposition methods known in the art, such as screen printing of flux followed by solder ball placement using standard solder ball pick and place equipment. The interconnect paste 212 may comprise a height 216. A height 214 of the stress compensation layer 202 may be less than the height 216 of the interconnect paste 212. In one embodiment, the height 214 of the stress compensation layer 202 may comprise about 10 percent to about 60 percent of the height 216 of the interconnect paste 212.

The interconnect paste 212 may be exposed to a heating process 217, as is known in the art, in which the interconnect paste 212 may be heated to form at least one interconnect structure 220 (FIG. 2*g*). A height after heating 215 of the stress compensation layer 202 may be less than the height 216 of the interconnect paste 212. In one embodiment, the heating process 217 may comprise a reflow process and/or a die attach process, as is known in the art. In one embodiment, the heating process 217 may comprise a temperature from about 230 degrees to about 280 degrees Celsius. A joint structure 222 may generally comprise the at least one interconnect structure 220 disposed on the second substrate 200 with the stress compensation layer 202 disposed between at least two of the at least one interconnect structure 220.

Figure 3A:
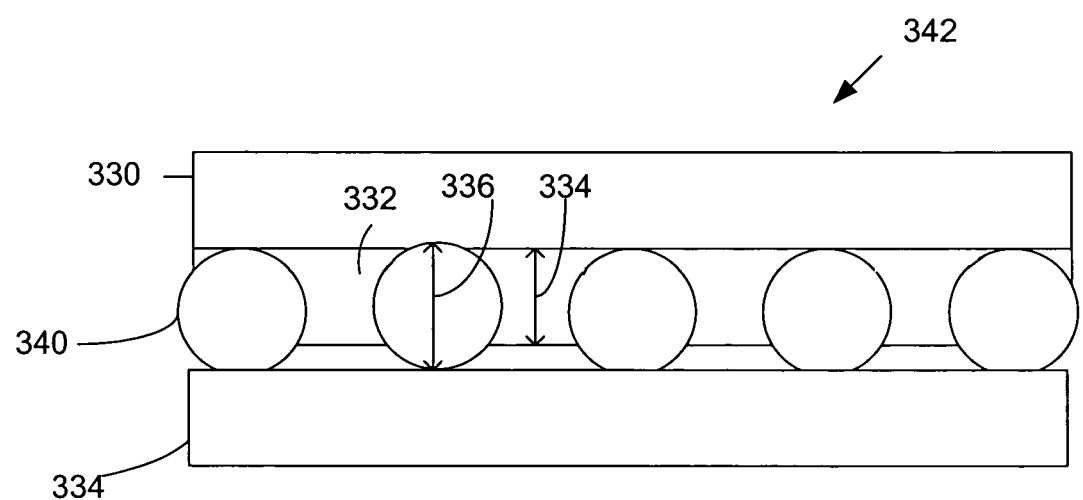
FIGS. 3a-3b represents structures comprising a system according to an embodiment of the present invention.
Figure 3B:
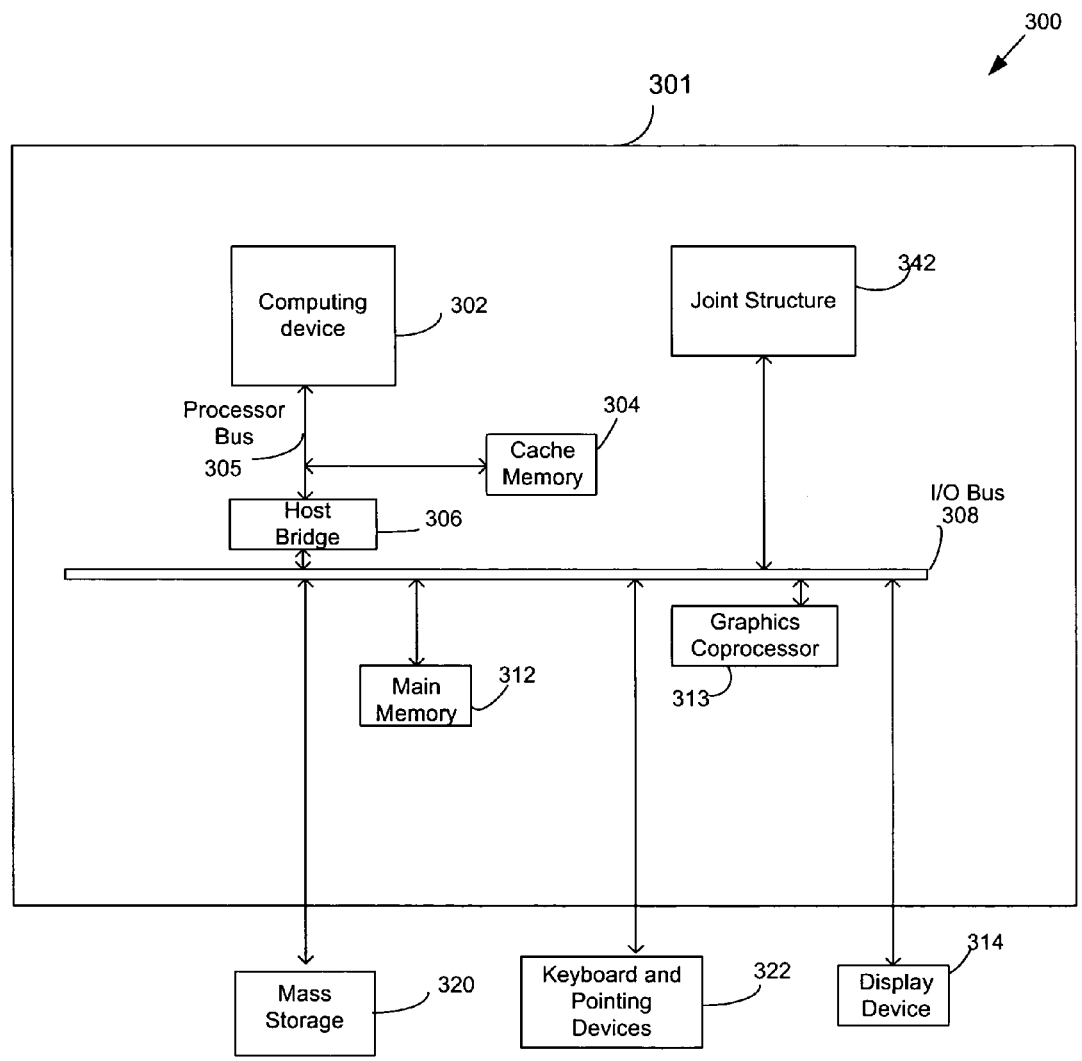

FIG. 3*a* depicts a joint structure 342 that may be used in a system, such as in the system 300 depicted in FIG. 3*b*. The joint structure 342 may comprise a first substrate 334. In one embodiment, the first substrate 334 may comprise a motherboard (such as a printed circuit board), a land grid array, an interposer and/or a test coupon, for example. At least one interconnect structure 340 may be attached to both the first substrate 334 and to a second substrate 330. In one embodiment, the second substrate 330 may comprise a package substrate, for example.

A stress compensation layer 332, (similar to the stress compensation layers 102 and 202), may be disposed between at least two of the at least one interconnect structure 340. The stress compensation layer 332 may comprise a height 334 that is less than a height 336 of the at least one interconnect structure 340. The stress compensation layer 332 may strengthen the interface between the second substrate 330 and the at least one interconnect structure 340 by providing stress relief and structural support at the interface.

Since the stress compensation layer 332 may comprise a height 334 that is less than the height 336 of the at least one interconnect structure 340, a top surface (not shown, but similar to the top surface 121 of FIG. 1*i*) may be substantially free of surface contamination. Thus, the methods of the present invention may serve to avoid and/or substantially reduce the surface contamination that may likely be present when the stress compensation layer 332 is formed after the interconnect structures are formed, such as may be the case in prior art structures, for example as depicted in FIG. 4. Therefore, the stress compensation layer 332 may greatly increase the reliability and reduce interface related failures and/or joint failures of devices utilizing the methods and structures of certain embodiments of the present invention.

FIG. 3*b* is a diagram illustrating an exemplary system capable of being operated with methods for fabricating a microelectronic structure, such as the joint structure 342 of FIG. 3*a* for example. It will be understood that the present embodiment is but one of many possible systems in which the joint structures of the present invention may be used. The system 300 may be used, for example, to execute the processing by various processing tools, such as but not limited to die attach tools, as are well known in the art, for the methods described herein.

In the system 300, a joint structure 342 may be communicatively coupled to a printed circuit board (PCB) 301 by way of an I/O bus 308. The communicative coupling of the joint structure 342 may be established by physical means, such as through the use of a package and/or a socket connection to mount the joint structure 342 to the PCB 301 (for example by the use of a chip package and/or a land grid array socket). The joint structure 342 may also be communicatively coupled to the PCB 301 through various wireless means (for example, without the use of a physical connection to the PCB), as are well known in the art.

The system 300 may include a computing device 302, such as a processor, and a cache memory 304 communicatively coupled to each other through a processor bus 305. The processor bus 305 and the I/O bus 308 may be bridged by a host bridge 306. Communicatively coupled to the I/O bus 308 and also to the joint structure 342 may be a main memory 312. Examples of the main memory 312 may include, but are not limited to, static random access memory (SRAM) and/or dynamic random access memory (DRAM), and/or some other state preserving medium. The system 300 may also include a graphics coprocessor 313, however incorporation of the graphics coprocessor 313 into the system 300 is not necessary to the operation of the system 300. Coupled to the I/O bus 308 may also, for example, be a display device 314, a mass storage device 320, and keyboard and pointing devices 322.

These elements perform their conventional functions well known in the art. In particular, mass storage 320 may be used to provide long-term storage for the executable instructions for a method for forming joint structures in accordance with embodiments of the present invention, whereas main memory 312 may be used to store on a shorter term basis the executable instructions of a method for forming joint structures in accordance with embodiments of the present invention during execution by computing device 302. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 312 may supply the computing device 302 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as joint structures, are well known in the art. Therefore, the Figures provided herein illustrate only portions of an exemplary microelectronic device that pertains to the practice of the present invention. Thus the present invention is not limited to the structures described herein.

What is claimed is:

1. A method of forming a structure comprising;
   forming a stress compensation layer directly on a package substrate, wherein the stress compensation layer comprises a no-flow underfill material;
   forming at least one opening within the stress compensation layer with a microtool, the forming performed while the stress compensation layer is at a temperature between 80 to about 120 degrees Celsius to provide fluidity of the stress compensation layer during the forming of the at least one opening, wherein the at least one opening comprises a planar bottom surface and at least one sidewall, and wherein the at least one opening is formed to be in direct contact with the substrate;
   forming an interconnect paste within the at least one opening, wherein the interconnect paste is in direct contact with the substrate; and
   forming a solder ball from the interconnect paste in the at least one opening.

2. The method of claim 1 wherein forming a stress compensation layer on a substrate comprises: forming a stress compensation layer on a substrate; and removing moisture from the stress compensation layer, wherein the temperature of the moisture removal does not substantially cure the stress compensation layer.

3. The method of claim 1 further comprising heating the interconnect paste to form the solder ball.

4. The method of claim 3 wherein a height of the stress compensation layer is less than a height of the solder ball.

5. The method of claim 3 wherein heating the interconnect paste to form the solder ball comprises reflowing the interconnect structures at a temperature between about 230 degrees Celsius and 280 degrees Celsius.

6. The method of claim 3 wherein heating the interconnect paste to form the solder ball further comprises curing the stress compensation layer.

7. The method of claim 1 wherein forming at least one opening within the stress compensation layer further comprises exposing the at least one opening within the stress compensation layer to a cleaning process.

8. The method of claim 1 wherein forming an interconnect paste within the at least one opening comprises forming an interconnect paste within the at least one opening, wherein a height of the stress compensation layer is less than a height of the interconnect paste.

9. The method of claim 1 wherein forming an interconnect paste within the at least one opening, wherein the height of the stress compensation layer is less than the height of the interconnect paste comprises forming an interconnect paste within the at least one opening, wherein the height of the stress compensation layer is about 10 to about 60 percent of the height of the interconnect paste.

10. The method of claim 1 wherein forming the stress compensation layer comprises at forming at least one of epoxy, a cyanate ester, a polyimide, a polybenzoxazole, a polybenzimidazole, and a polybenzothiazole.

11. The method of claim 1 wherein forming the interconnect paste comprises forming a solder paste by at least one of stencil printing, solder jetting and solder mold transfer.

* * * * *